United States Patent
Peters et al.

(10) Patent No.: US 7,269,522 B2
(45) Date of Patent: Sep. 11, 2007

(54) FIRMWARE POWER CYCLE ROUTINE

(75) Inventors: Mike Peters, Seneca, SC (US); Jerome Bartier, Seneca, SC (US)

(73) Assignee: Itron, Inc., Liberty Lake, WA (US)

( * ) Notice: Subject to any disclaimer, the term of this patent is extended or adjusted under 35 U.S.C. 154(b) by 0 days.

(21) Appl. No.: 11/211,138

(22) Filed: Aug. 24, 2005

(65) Prior Publication Data

US 2006/0044157 A1 Mar. 2, 2006

Related U.S. Application Data

(60) Provisional application No. 60/604,897, filed on Aug. 27, 2004.

(51) Int. Cl.
*G06F 19/00* (2006.01)

(52) U.S. Cl. .......................... 702/61; 702/57

(58) Field of Classification Search ................ 702/57, 702/61; 324/76.61
See application file for complete search history.

(56) References Cited

U.S. PATENT DOCUMENTS

| | | | |
|---|---|---|---|
| 4,361,877 A | 11/1982 | Dyer et al. | |
| 4,387,296 A | 6/1983 | Newell et al. | |
| 4,509,128 A | 4/1985 | Coppola et al. | |
| 4,783,623 A | 11/1988 | Edwards et al. | |
| 5,469,049 A | 11/1995 | Briese et al. | |
| 6,219,656 B1 | 4/2001 | Cain et al. | |
| 6,512,644 B1 | 1/2003 | Hall et al. | |
| 6,684,111 B2 | 1/2004 | Klein et al. | |
| 6,745,138 B2 * | 6/2004 | Przydatek et al. | 702/61 |
| 6,798,353 B2 | 9/2004 | Seal et al. | |
| 6,871,150 B2 * | 3/2005 | Huber et al. | 702/62 |
| 2003/0014200 A1 | 1/2003 | Jonker et al. | |

OTHER PUBLICATIONS

PCT International Search Report for International Application No. PCT/US05/30267 dated May 2, 2006.

* cited by examiner

*Primary Examiner*—John Barlow
*Assistant Examiner*—Douglas N Washburn
(74) *Attorney, Agent, or Firm*—Dority & Manning, P.A.

(57) ABSTRACT

Apparatus and methodology ensure reliable electricity meter data recordation and maintenance during ongoing operation and any power failure. During normal operations, data committed to memory is immediately read to determine write success. Upon detection of any power failure while monitoring operating power, a reset procedure is entered that ensures provision of reliable initialization data upon restart of the metering operation. Power failure detection may be based on decreases in a voltage associated with the meter metrology board or of a storage capacitor, while clearance for normal mode (i.e., after a power failure) depends on both such voltages passing testing for minimum values. Such combined approach provides a hysteresis effect, for less sensitivity to noise and some adverse AC line conditions. So-called dynamic data (energy flow and amount) is collected for storage by monitoring an interface between the metrology components of the meter and a meter register.

27 Claims, 4 Drawing Sheets

FIRMWARE POWER CYCLE ROUTINE

PRIORITY CLAIM

This application claims the benefit of U.S. Provisional Application No. 60/604,897, entitled "FIRMWARE POWER CYCLE ROUTINE", filed Aug. 27, 2004, which is incorporated herein by reference for all purposes.

FIELD OF THE INVENTION

The present subject matter generally concerns improved processes or techniques for ensuring the integrity of meters during power outages, and more particularly concerns improved memory integrity of electricity meters such that the memory is always in a state that previous data may be retrieved.

BACKGROUND OF THE INVENTION

The present subject matter concerns both apparatus and methodology in the area of metering, including the use of practical computer software applications involving an algorithm approach to produce a useful, concrete and tangible result, i.e., namely, a stored data value for consumed electricity (or other commodity) to be charged to a customer's account.

The general object of metrology is to monitor a physical phenomenon to permit a record of the monitored event(s). If the potential to record the measured or monitored data is lost, then the entire basic purpose of the metering device and/or effort fails. Such basic function and purpose of metering devices can be applied to a number of contexts. One broad area of measurement relates, for example, to utility meters. These may include the monitoring of consumption of a variety of forms of energy or other commodities, such as electricity, water, gas, and oil, to name a few.

Historically, a mechanical form of register was used for utility meters. Such an approach provided a relatively dependable field device with certain inherent functional advantages. For example, if the flow of the consumable commodity being measured was interrupted, the mechanical form of gauge simply stopped in its place, automatically reflecting the previous accumulation without other arrangements being required, and without any loss of such accumulated data. After resumption of the flow of the commodity, the mechanical register could then simply begin to add additional flow values to the previous accumulation, so that accurate data was reflected at all times regardless of intermittent commodity flow interruptions.

Also, in many instances, the gauge or register required no separate power supply since it was operated directly by the commodity flow. In the case of electricity meters, the mechanical register could be electrically powered. Hence, when power was lost, the measurement function was temporarily moot so no measurement functionality was lost even though the gauge itself would be temporarily without power.

As the technology of metering devices progressed, mechanical registers began to be replaced with more electrical-based devices and electronic forms of registers. Generally speaking, all such devices require some form of electrical power for their operation and data storage function. Such fact created the potential for catastrophic loss of accumulated data, i.e., the failure of the entire purpose of the measuring device if data representing accumulated commodity usage were lost.

For example, in the case of an electricity meter, electric power is already flowing to and through the metering or measuring device. Such fact makes for a convenient supply of electricity, without having to attempt to rely on battery operation or some other source of electrical power. However, such an arrangement, while advantageous in certain aspects, is inherently susceptible to the loss of electrical power to the measuring device including its register at the same time there is any power loss to the customer's location, for example, home or business.

Intermittent power outages or other conditions, such as brown outs can occur in even the best-maintained systems. For example, an electrical power system can become damaged due to storm debris (e.g., falling limbs) or high winds, or from an accident (for example, vehicles such as trucks or cars knocking down utility poles and power lines). Under certain load shedding conditions, it may even become necessary for power to a given location to be deliberately interrupted.

Regardless of such causes, or possibly other sources of power outages, the inherent problem is that an electrical measuring device with an electrically powered register may lose its accumulated data in the event of a power outage. Prior attempts have been made to address such technical problem.

U.S. Pat. No. 6,684,111 B2 to Klein et al. for Apparatus for Power Failure Identification in a Programmable Household Appliance and Method for Identifying Power Failure, issued Jan. 27, 2004, discloses a technique wherein a signal representing the mains supply voltage is compared to a power supply signal by a subroutine of the operating software of an appliance. Upon identification of a power failure, data relating to the operational state of the appliance is stored in a memory so that operation may resume at the same point in the operational sequence upon power restoration. U.S. Patent Application Publication U.S. 2003/0014200 A1 to Jonker et al. for Revenue Meter With Power Quality Feature, published Jan. 16, 2003, discloses an electricity meter and data storage technique wherein all recorded and computed data is moved to non-volatile storage in the event a power quality event jeopardizes the operational power of the meter.

U.S. Pat. No. 6,512,644 B1 to Hall et al for Method and Apparatus for Read-After-Write Verification With Error Tolerance, issued Jan. 28, 2003, discloses a technique wherein a read-after-write test is performed and a decision is made as to whether it is necessary to rewrite a data block, based on the number of errors detected. U.S. Pat. No. 6,219,656 B1 to Cain et al. for Memory Integrity for Meters, issued Apr. 17, 2001, discloses an electricity meter and data storage technique involving the possibility of a second write operation to ensure successful storage of the corresponding data. U.S. Pat. No. 4,387,296 to Newell et al. for Portable Utility Billing Apparatus, issued Jun. 7, 1983, describes a meter reader carried apparatus for storing data read from individual customers electricity meter, which can involve a visual display and an audible alarm if data written onto a magnetic tape is incorrect. U.S. Pat. No. 4,361,877 to Dyer et al. for Billing Recorder with Non-volatile Solid State Memory, issued Nov. 30, 1982, describes an apparatus for measuring and recording energy consumption data in a bubble memory such that a notation is made if an error persists after repeated storage attempts.

Other arrangements and aspects of electronic-based electricity meters are known. See, for example, disclosures set forth in U.S. Pat. Nos. 4,783,623; 5,469,049 and 4,509,128.

The disclosures of all such patents are hereby incorporated herein by reference, for all purposes.

BRIEF SUMMARY OF THE INVENTION

In view of the recognized features encountered in the prior art and addressed by the present subject matter, an improved system and method for metrology operations within utility meters (particularly for electricity meters) has been developed. More particularly, a particular aspect of certain embodiments of the present subject matter involves improved measurement integrity through preservation of data despite intermittent power outages. More generally, apparatus and methodology are provided to ensure reliable meter data recordation and maintenance (such as electricity meter data) during ongoing operation and during any power failure.

Another more particular aspect of certain embodiments of the present subject matter relates to providing improved apparatus and methodology for memory integrity for electricity meters. In such context, it is a general aspect of the present subject matter to provide for improved integrity of stored electricity meter quantities including, but not limited to, such items as either energy or demand usage. In such context, it is desirable to facilitate the reliable storage of measurement data under varying power supply conditions.

Still another general aspect of certain embodiments of the present subject matter relates to providing a practical application of computer software to produce a useful, concrete and tangible result, namely, improved memory integrity of metrology results, such as may be obtained with utility meters, particularly such as electricity meters. In such particular context, it is an aspect of certain embodiments of the present subject matter to ensure that data is correctly committed to memory and is properly maintained even in the face of complete power loss.

In the context of electricity meters, it is another aspect of certain embodiments of the present subject matter to make use of a dual storage technique or algorithm so as to assure there will always be a previous electricity meter value retained, thus preventing full loss of desired data at power down. In such context, it is an aspect of certain embodiments of the present subject matter to provide improved metrology technology that makes improved use of non-volatile memory devices, but without requiring additional circuits for direct fault detection or other arrangements to provide for use of the non-volatile memory.

It is another general aspect of certain embodiments of the present subject matter to provide an apparatus and improved technology which may be advantageously implemented through, and with the assistance of, specific computer software for implementing a memory integrity algorithm for double buffering the stored data involved by maintaining and updating two separate areas of memory for quantities stored, such as electricity meter quantities.

Additional aspects and advantages of the present subject matter are set forth in, or will be apparent to those of ordinary skill in the art from, the detailed description herein. Additional aspects and advantages of the present subject matter are set forth in, or will be apparent to, those of ordinary skill in the art from the detailed description herein. Also, it should be further appreciated that modifications and variations to the specifically illustrated, referred and discussed features and steps hereof may be practiced in various embodiments and uses of the present matter without departing from the spirit and scope of the present subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of this subject matter may include various combinations or configurations of presently disclosed steps or features, or their equivalents (including combinations of steps or features or configurations thereof not expressly referenced in the figures or stated in the detailed description).

One present exemplary embodiment relates to an electricity meter for monitoring electrical parameters relating to power flow from a source to a load. Such a present exemplary electricity meter may include a metrology portion, a memory portion, and a power monitoring portion. Such exemplary metrology portion may preferably include a dynamic data gathering portion, a power supply portion, and a controller portion, with such controller portion being configured and operative for causing the electricity meter to variously operate in at least one of a power-up mode, a normal mode, and a power fail mode. Such exemplary memory portion may preferably have a first memory area, a second memory area, and a third memory area, with such first memory area and such second memory area being configured for storing dynamic data collected by said dynamic data gathering portion of the metrology portion, and with such third memory area being configured for storing static data. Still further, such power monitoring portion may preferably have an input configured for monitoring a source and have an output portion. In such one exemplary electricity meter in accordance with present subject matter, such controller portion of the metrology portion is configured and operative for causing the dynamic data gathering portion to collect dynamic data and to alternately store such collected dynamic data in the first memory area and the second memory area, and to control a power-up operation of the electricity meter during such power-up mode such that upon such power-up operation such controller portion preferably sets initial operating parameters for such electricity meter based on static data stored in such third memory area and based on collected dynamic data stored in a predetermined one of the first memory area and the second memory area.

In another present exemplary embodiment in accordance with the present subject matter, a utility meter is provided with improved memory integrity for preservation of consumption data regardless of intermittent power outages. Such meter preferably includes electronic metrology means for monitoring and sensing consumption of a utility commodity and for generating corresponding consumption data relative thereto in predetermined seriatim data sets; a pair of non-volatile memory storage devices operative in tandem as double buffered storage elements; and read/write logic for operating such memory storage devices in relation to such predetermined seriatim data sets such that valid consumption data is maintained if operatively possible in at least one of such non-volatile memory storage devices. In such example, such read/write logic preferably operates so as to write to a first memory portion of the pair of non-volatile memory storage devices a first data set collected during the step of collecting; to write to a second memory portion of such pair of non-volatile memory storage devices a second data set collected during the step of collecting; to write subsequently collected individual data sets alternately to the first memory portion and the second memory portion; to read each data set immediately after each step of writing such data set; to compare each such read data set with such written data set; to rewrite such data set if the step of comparing indicates that each such read data set is not equal to such written data set; and to repeat the steps of comparing and rewriting a predetermined number of times.

It should be well understood that the present subject matter equally concerns corresponding methodology, such as a method for operation of a utility meter to improve memory integrity thereof for preservation of consumption data regardless of intermittent power outages. Such an exemplary method may include the the steps of:

providing a first memory portion associated with a utility meter;

providing a second memory portion associated with such utility meter;

collecting consumption data in the form of individual data sets seriatim from a data source associated with such utility meter;

writing to the first memory portion a first data set collected during the step of collecting;

writing to the second memory portion a second data set collected during the step of collecting;

writing subsequently collected individual data sets alternately to the first memory portion and the second memory portion;

reading each data set immediately after each step of writing such data set;

comparing each such read data set with such written data set;

rewriting such data set if the step of comparing indicates that each such read data set is not equal to such written data set; and repeating the steps of comparing and rewriting a predetermined number of times.

Still further, another present exemplary embodiment particularly relating to methodology involves a method for operating an electricity meter for preservation of consumption data stored therein regardless of intermittent power outages, such electricity meter of the type having a dynamic data gathering portion, a power supply portion, a controller portion, a memory portion, and a power monitoring portion. Such exemplary preferred method comprises the steps of:

a) storing meter initialization values in the memory portion;

b) incrementing a first counter if the output from the power supply portion is greater than a first predetermined initialization value;

c) resetting such first counter if the output from the power supply portion is not greater than such first predetermined initialization value;

d) incrementing a second counter if the output from the power monitoring portion is greater than a second predetermined initialization value;

e) resetting such second counter if the output from the power monitoring portion is not greater than such second predetermined initialization value;

f) repeating steps b) through e) if the count stored in such first counter does not exceed a third predetermined initialization value and if the count stored in such second counter does not exceed a fourth predetermined initialization value; and g) causing the electricity meter to enter a normal operation mode.

One exemplary embodiment of the present subject matter relates to improved memory integrity making use of a double buffered process of maintaining and updating two areas of memory for quantity stored data, such as for electricity meters. One area holds a most recent reading while the other holds a prior reading. In accordance with such technique or algorithm, the older of such two memories is updated. Practice of such an arrangement and/or technique advantageously permits, for example, an electricity meter, to maintain any quantity, such as an increasing register kWh (kiloWatt-hour) reading in a fault tolerant environment.

Other exemplary embodiments of the present subject matter may make use of various memory types, such as non-volatile technology devices. Such devices may include, for example, EEPROM (Electrically Erasable Programmable Read-Only Memories) FLASH memory devices, magnetic media, or battery backed RAM (Random Access Memory). As another aspect of the present subject matter, any of such non-volatile technology memory devices may be located either internally or externally to the processing device.

In accordance with aspects of certain embodiments of the present subject matter, each such memory device would be utilized so as to constitute double-buffered areas, with each buffer having its own checksum-value. As is well know to those of ordinary skill in the art, a checksum is a method used to validate data that is transmitted to and from a processing device and its storage media (which, as referenced, may be varied in accordance with the present subject matter). Using a dual storage algorithm or technique in accordance with the present subject matter assures that a previous value is always retained, thereby preventing full energy loss during any power outage.

Further in accordance with certain aspects of exemplary embodiments of the present subject matter, only one of the at least dual areas (i.e., the older value) is updated to a new value at any one time.

In still further aspects of certain embodiments of the present subject matter, a technique or algorithm is provided that manages and oversees the memory write operation so as to coincide, in the instance of an electricity meter, with a certain unit of energy for a kWh reading or unit of time for a kW reading. In accordance with aspects of certain embodiments of the present subject matter, the unit of measure is chosen so as to be small enough that it will not significantly affect the accuracy of the value being stored in the event that the attempted storing (i.e., memory write operation) fails. At the same time it is chosen so as not to be so small as to exceed (cumulatively) the service life of the non-volatile memory device. Such is a concern, for example, in the case of EEPROM devices, which have a limited number of times that a memory location may be written.

In accordance with aspects of the present subject matter, the storing technique or algorithm is not triggered by any power outage, so the need to have a warning of a power failure to initiate a dynamic data storage routine is obviated. The present subject matter, however, does provide for an early warning of power failure and, thereby permits execution of a power failure routine if such may be desired.

In accordance with still further aspects of certain embodiments of the present subject matter a power up methodology is provided that ensures that the alternating current (AC) line input to an electricity meter provided with the present technology is stable and that power supply voltages are stable before the metrology contained within an electricity meter resumes normal operations.

In accordance with yet still further aspects of certain embodiments of the present subject matter there is provided a technique or algorithm that ensures that a write operation to a non-volatile memory is verified immediately after dynamic data is written. If a write failure is detected, a predetermined number of additional write attempts may be made before a system reset is initiated. In such event, in accordance with the subject matter presently, the maximum data lost is the preselected unit of measure since the most recent (i.e., previous) update. For example, if there were a power failure as the data writing process is being performed, then the write operation would fail. Upon the return of power, such attempted update of the older value would be found to have a bad checksum. In such instance, in accordance with the subject technique or algorithm, the most recently successfully stored energy value would be returned. Hence, the lost amount of energy (i.e., data about such energy) during the interim would only be the managed incremental unit of energy (i.e., data about such energy).

It is to be understood by those of ordinary skill in the art that the present subject matter involves both apparatus implementing such techniques and the computer software or other implementations of flow charts and/or algorithms as involved with the present technology, for constituting a practical application of such techniques or algorithms for producing a useful, concrete and tangible result.

Yet for further exemplary present embodiments, during normal operations, data committed to memory is immediately read to determine write success. In the context of such particular examples, upon detection of any power failure while monitoring operating power, a reset procedure may be entered that ensures provision of reliable initialization data upon restart of the metering operation. Power failure detection in such exemplary instance may be based on decreases in a voltage associated with the meter metrology board or of a storage capacitor, while clearance for normal mode (i.e., after a power failure) for example, may depend on both such voltages passing testing for minimum values. Such combined approach in such example provides a hysteresis effect, for less sensitivity to noise and some adverse AC line conditions.

In other aspects of present exemplary embodiments, it may be understood that so-called dynamic data (energy flow and amount) is collected for storage by monitoring an interface between the metrology components of the meter and a meter register.

Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Repeat use of reference characters throughout the present specification and appended drawings is intended to represent same or analogous features, elements, steps, or aspects of the present subject matter.

DETAILED DESCRIPTION OF THE PREFERRED EMBODIMENTS

As discussed in the Brief Summary of the Invention section, the present subject matter is particularly concerned with an improved system and method for metrology operations within meters such as electric meters involving improved measurement integrity through preservation of data despite intermittent power outages.

Figure 1:
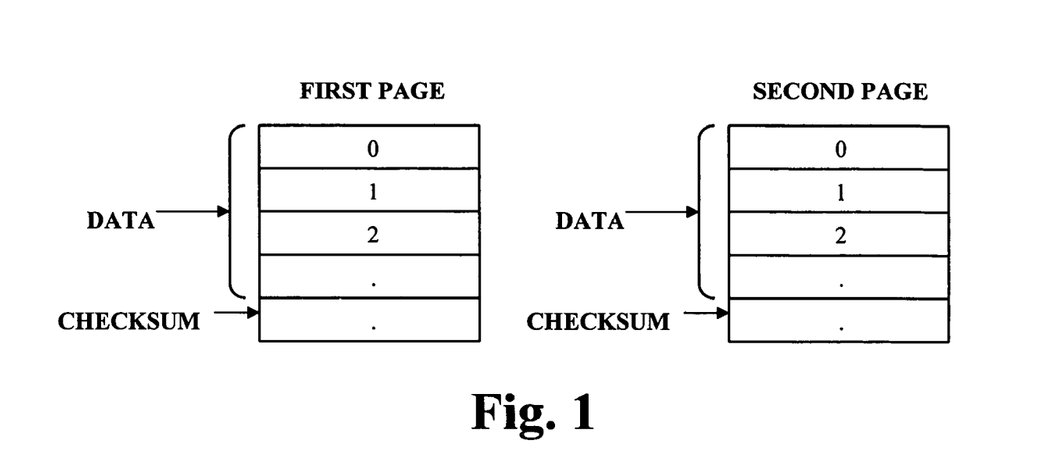
FIG. 1 is a diagrammatic illustration of an exemplary configuration of first and second memory pages of an exemplary embodiment of a data store in accordance with the present subject matter.

With specific reference to FIG. 1, a diagrammatic illustration of first and second memory pages of a data store contained within a metrology package of, for example, an electricity meter in accordance with the present subject matter is shown. As illustrated, each page within the memory contains portions assigned to data and a portion assigned to a checksum value. The checksum, as is well known to those of ordinary skill in the art, provides a mechanism whereby the values stored as data may be verified. In the present exemplary configuration, the checksum may correspond to a two-byte CRC16 checksum, although such is not a specific limitation of the present subject matter as other forms of checksums may be employed.

Figure 2:
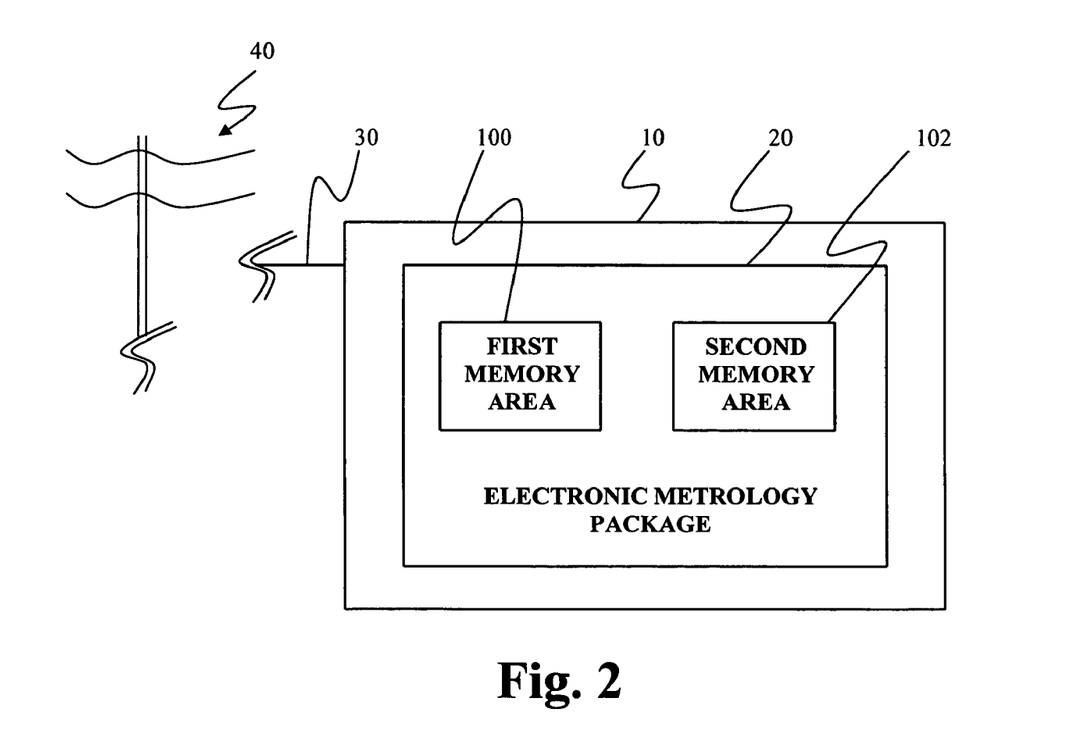
FIG. 2 is a diagrammatic illustration of an exemplary data storage memory in accordance with the present subject matter.

FIG. 2 broadly represents in block diagram schematic form various hardware aspects of the present subject matter including various computer software and hardware implementations thereof. In the example of an electricity meter, such a meter or metering device generally 10 may receive power input 30 from a power grid or power distribution system represented by power lines 40. It should be borne in mind that the single illustrated input line 30 is representative and actually may correspond to a plurality of lines (e.g., multiple phases) depending on the metrology requirements of the particular area of use for the electricity meter.

Incorporated within metering device 10 or associated therewith may be an electronic metrology package or processing device 20. As understood from the present disclosure, such processing device 20 may include or be associated with an electronic register for outputting electricity meter quantities. Such register may not be externally visible, as such may employ an RF output or other form of output not requiring visualization at meter 10, such as by a "walk-by" meter reader or the like.

Further in accordance with the present subject matter, a pair of memory areas 100 and 102 may comprise first and second pages, respectively, of a double-buffered storage for practicing process or algorithm aspects in accordance with present subject matter. Such two pages 100 and 102 are intended as representing all various forms of non-volatile memory storage devices referenced above and their equivalents. Hence, FIG. 2 shows in broad relationship a schematic of certain basic aspects in accordance with certain embodiments of the present subject matter. Such broadly defined depiction is intended as representing variations in any implementation of the present subject matter, as to content and use of computer software and/or hardware devices. Those of ordinary skill in the art would be able to formulate corresponding computer software, such as microprocessor executable code, for implementing the particular methodologies as will be described herein for ensuring reliable storage of data collected by way of the electronic metrology package 20.

In accordance with the present technology, data collected by way of electronic metrology package 20 within electricity meter 10 is written to memory areas 100 and 102 in alternate fashion. That is, for example, a "first" or initial reading may be written to memory area 100, with a "second" or subsequent reading written to area 102, and with following or subsequent readings being written, alternating between the two areas. Memory areas 100, 102, in accordance with the present subject matter, may correspond to non-volatile memory devices or separate portions of a single memory device. In an exemplary configuration, the non-volatile memory device may correspond to an 8-kbit EEPROM that possesses 32 byte page write capability.

Dynamic data collected by the electronic metrology package 20 may be page written so as to provide the most efficient commitment of memory. By way of further specific example, it may be understood that the EEPROM may be blocked off in page byte boundaries with some blocks spanning several pages. Blocks of particular interest may be structured in the EEPROM as static blocks that contain configuration information that is static or unchanging information relating to, for example, electricity meter configuration data, versus dynamic blocks (in other areas of the exemplary configuration) that contain raw and/or processed metrology data or information.

Such dynamic data in exemplary embodiments may correspond to two physical blocks of the EEPROM that are formatted the same so as to contain the same type of metering information. These dynamic data blocks may, in an exemplary configuration, consume two pages, respectively. This means that each such exemplary dynamic block may each comprise 32 total bytes of information. The dynamic data blocks may be located at different physical addresses, for example, separated from one another by several pages. Both such exemplary dynamic data blocks may contain a CRC16 checksum value at the end of the block. The dynamic data stored in a selected one of the non-volatile memory areas 100 and 102 may preferably serve as initialization data upon a power up if the electricity meter experiences a power fail, as will be discussed further with respect to FIG. 4 herein.

A particular aspect of certain embodiments of the present subject matter corresponds to the methodology surrounding the process of writing data to the two memory areas 100 and 102. In an exemplary configuration, the write cycle specification for the EEPROM may be ten million writes for each individual cell of the EEPROM memory. In accordance with the present subject matter, dynamic data is written to the EEPROM in alternating dynamic block writing fashion in order, in part, to extend the life of the EEPROM. Thus, for example, if ten million dynamic block writes were performed, then each dynamic block or cell would experience five million writes.

The methodology surrounding the write process corresponds to another significant aspect of the present technology as to some embodiments thereof in that once data is written to either of the areas 100 or 102, the data is immediately read from the respectively written area to ensure that the data was committed correctly. If it is determined that the data write process was unsuccessful, the data write process may be repeated with a subsequent reading of the memory area to determine if this second attempt were successful. Again, if this subsequent attempt is deemed unsuccessful, the write process followed by immediate read may be repeated a predetermined number of times prior to taking additional processing steps.

In certain embodiments of the present subject matter, the write and immediate read sequence, if unsuccessful, may be repeated for example 5 times before additional steps are taken. Other predetermined numbers of repeat attempts may be practiced, in accordance with the present subject matter. Such additional steps may, in an exemplary embodiment, include the posting of an error message on a meter display panel or the transmission of some other form of error message followed by a forced reset of the circuitry within the electronic metrology package 20 of the electricity meter 10.

It is to be understood by those of ordinary skill in the art that the memory integrity process (i.e., algorithm) of the present subject matter may be practiced in various embodiments, including various admixtures of computer software implemented devices and hardwired devices. Those of ordinary skill in the art, in order to satisfy their needs for a particular embodiment, would be able to put into practice their own selected variations of computer software and hardwired implementations of the present subject matter, based on the disclosure of this application, including specification and figures thereof. All such modifications and variations are intended to come within the spirit and scope of the present disclosure. Likewise, the foregoing embodiments are exemplary only, and their attendant description is intended by way of words of example rather than words of limitation.

Figure 3:
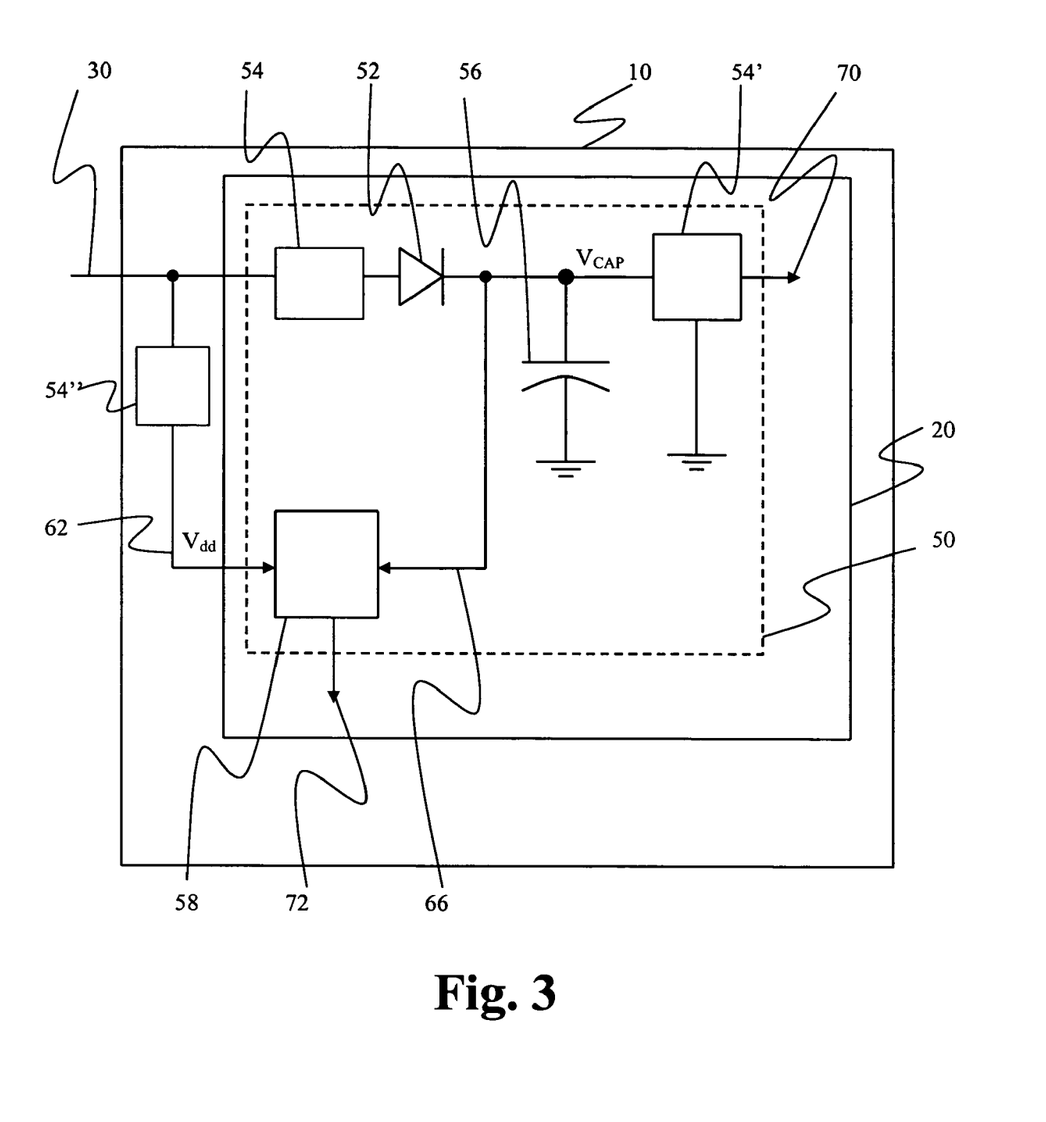
FIG. 3 is a partial schematic representation of an exemplary power supply and controller in accordance with the present subject matter.

With reference now to FIG. 3, illustrated is a partial schematic representation of an exemplary (i.e., representative) power supply and controller portion 50 of the electronic metrology package 20 within an electricity meter 10 in accordance with the present subject matter. Input line 30, previously described as an input line for the metrology components of the electricity meter, is also used as a supply source for the electronic metrology package 20. Representatively illustrated as connected to line 30 by way of other representatively illustrated power supply components 54 is a rectifier diode 52 whose cathode end may be coupled to a storage capacitor 56. An unregulated voltage $V_{CAP}$ is produced across storage capacitor 56 that may be applied to an input of voltage regulator 54' that may then be supplied by way of an output terminal 70 of regulator 54' to other electronic components within the electronic metrology package 20 of electricity meter 10. Again such is meant to be representative of the broader aspects of the present subject matter and to convey to those of ordinary skill in the art that the power supply portion of the electricity meter includes at least a rectifier portion producing an unregulated voltage represented as $V_{CAP}$ whose value will be one of the factors examined per present subject matter during certain operational aspects of the electricity meter.

Input line 30, previously discussed, may also be coupled to representatively illustrated power supply and voltage regulator 54". Voltage regulator 54" corresponds to a voltage regulator associated with the metrology board of the electricity meter whose regulated output voltage $V_{dd}$ is employed as a power supply for the metrology components. Representative voltage regulator 54" as well as previously mentioned voltage regulator 54' may correspond to integrated circuit regulators or electrical component equivalents comprising one or more transistors and/or other components necessary (as well understood by those of ordinary skill in the art). In accordance with the present technology, regulated output voltage $V_{dd}$ is monitored to detect whether or not the AC line voltage at input line 30 is present.

One additional component (a representative controller generally 58) is displayed within the power supply portion 50. Such representative controller 58 is employed to monitor and evaluate the regulated voltage $V_{dd}$ and the unregulated capacitor voltage $V_{CAP}$ and to produce signals on output line 72 representative of that evaluation, as will be more fully described later with respect to FIGS. 4 and 5. Controller 58 may correspond to an ASIC (application specific integrated circuit) device, a microcontroller, a microprocessor, a computer, hardwired circuitry or any other device or combination of devices or elements (as well understood by those of ordinary skill in the art) capable of performing the functions to be later described.

Figure 4:
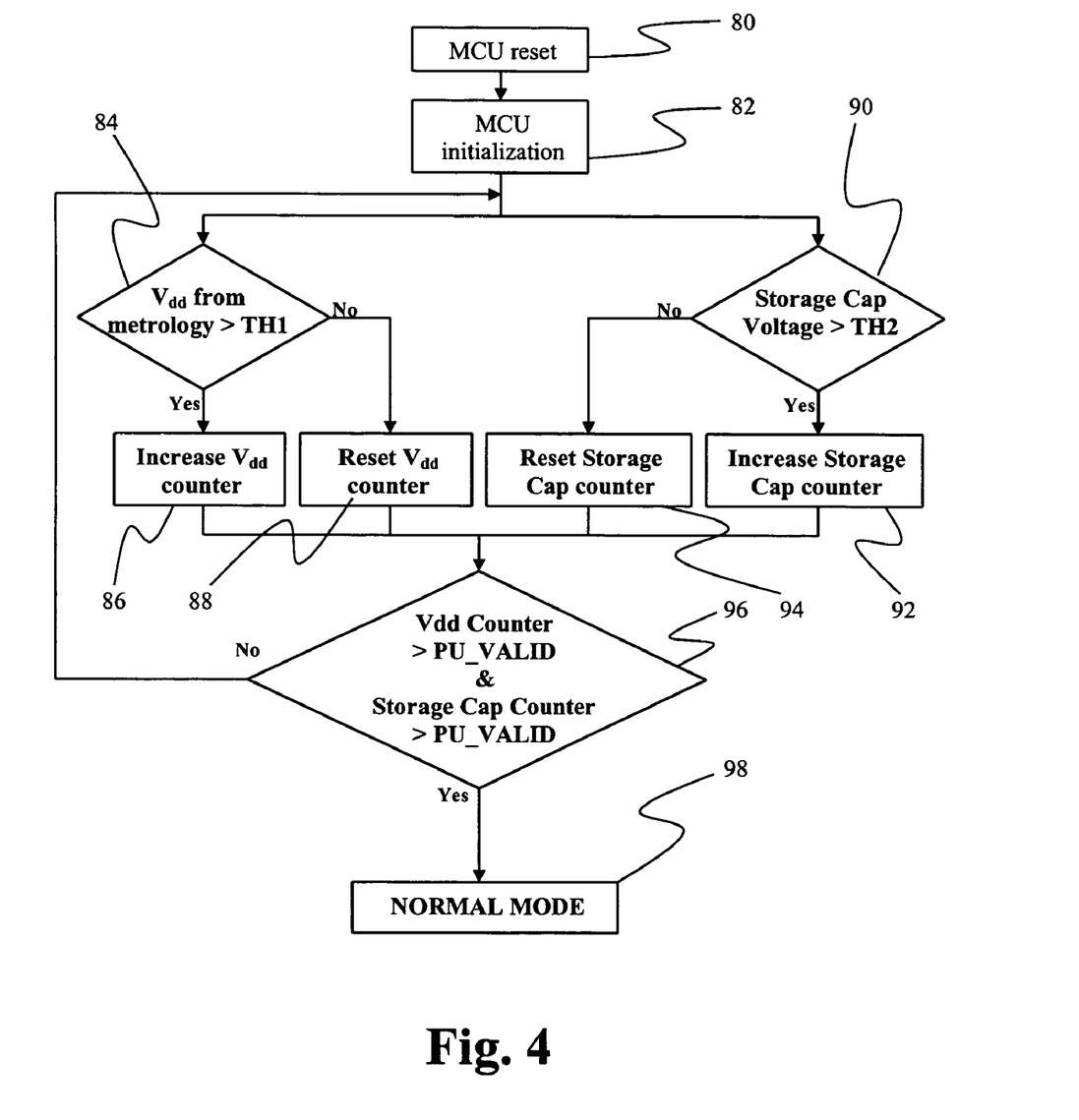
FIG. 4 is a flow chart representing an exemplary Power Up Routine (i.e., Power Up Operation) in accordance with the present subject matter.
Figure 5:
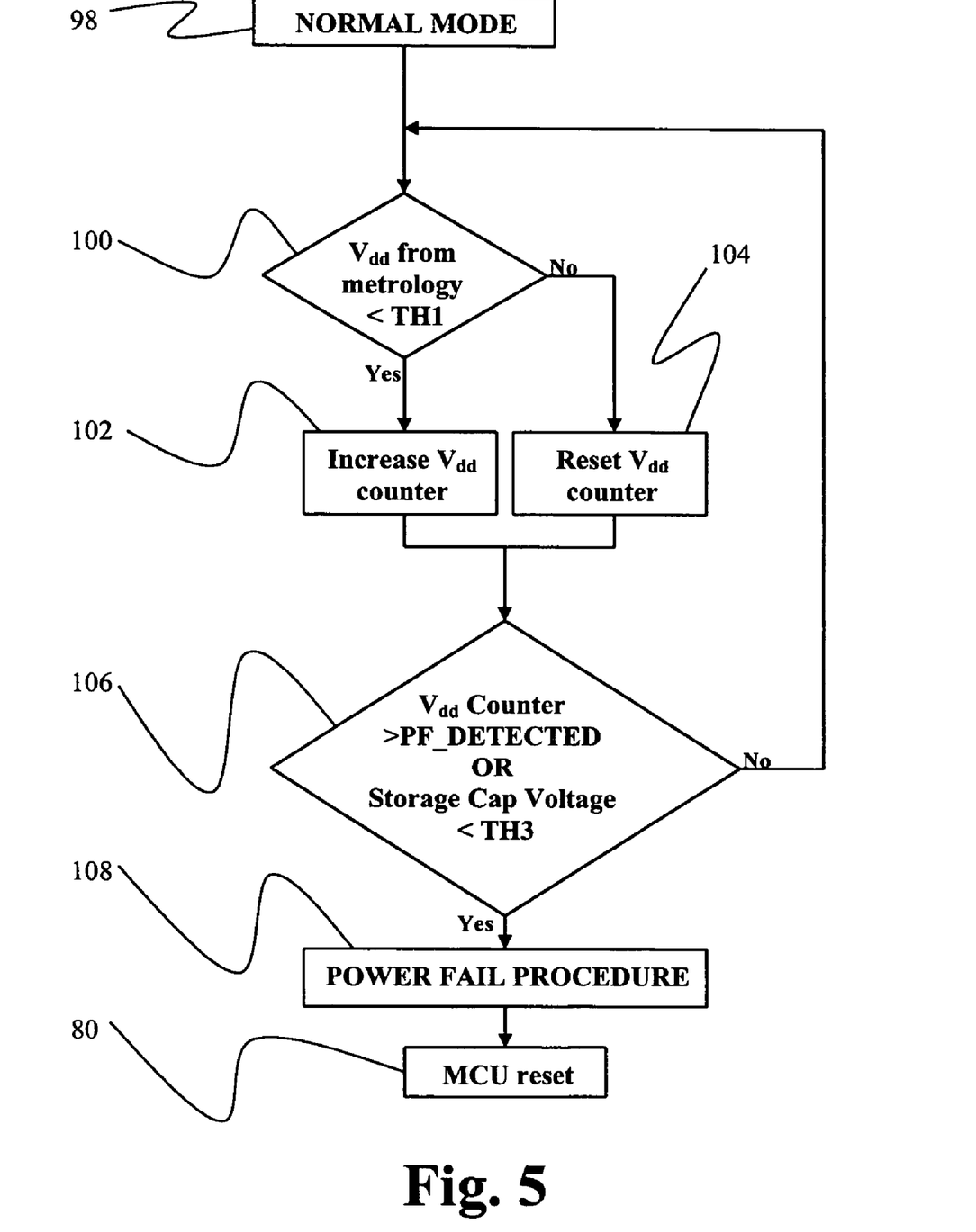
FIG. 5 is a flow chart representing an exemplary Power Fail Routine (i.e., Power Failure Detection Operation) in accordance with the present subject matter.

With reference now to FIGS. 4 and 5, it will be seen that flow charts representing a power up operation and a power failure detection operation, respectively, have been illustrated. FIG. 4 representatively illustrates a power up operation for the electronic metrology package 20 of electricity meter 10. In general, the electronic metrology package 20 may correspond to a microcontroller unit (MCU), although other devices including a microprocessor, a computer, an ASIC or other devices or combinations of devices as necessary to provide the herein discussed functionality may be employed.

As illustrated in FIG. 4, the power up process begins at step 80 where the MCU is reset to a basic state followed by step 82 where initialization values are loaded into memory components of the MCU. Such initialization values may correspond to previously stored dynamic data values, as will be discussed further with respect to FIG. 5, as well as static values that may variously relate to reference and threshold values necessary for the operation of the metrology within the electricity meter 10. For purposes of identification, such various reference and/or threshold values may be considered to be first and subsequent initialization values of the present subject matter, such as otherwise described in the present disclosure.

Following the initialization step 82, processing follows parallel paths wherein substantially simultaneous (but separate) evaluations of the regulated voltage $V_{dd}$ and the capacitor voltage $V_{CAP}$ may be undertaken in accordance with certain present exemplary embodiments. At step 84, voltage $V_{dd}$ from the power supply portion of the metrology (as discussed with reference to FIG. 3) is compared to a predetermined first threshold TH1. TH1 is a predetermined value, selected to represent a normal operational level for the regulated voltage $V_{dd}$ that, in turn, is representative of a proper level of AC line voltage being supplied from power lines 40 (FIG. 2) and, further in turn, made available to input line 30 (FIG. 2) and from there to the electricity meter 10. If $V_{dd}$ is greater than threshold value TH1, processing passes to step 86 (as shown per FIG. 4), where the value stored in a counter is increased to represent the fact that the regulated voltage $V_{dd}$ is at least above the threshold value TH1. If, on the other hand, the comparison performed in step 84 is negative, processing per the FIG. 4 representative embodiment proceeds to indicated step 88, where the value stored in the counter associated with $V_{dd}$ threshold comparisons is reset.

Further in accordance with present exemplary subject matter, substantially at the same time as comparisons are being made with respect to $V_{dd}$, the voltage $V_{CAP}$ across storage capacitor 56 (FIG. 3) is being evaluated at step 90, as indicated. Capacitor voltage $C_{CAP}$ (an unregulated voltage value) is compared in step 90 to a second predetermined threshold TH2 to determine whether such unregulated voltage is above such second threshold level. If such comparison test is positive in step 90, processing proceeds as indicated to step 92, wherein the value within a counter representing the storage capacitor voltage ($V_{CAP}$) is increased. On the other hand, if the comparison performed at step 90 is negative, processing proceeds as indicated to step 94, wherein the value stored in a counter associated with the capacitor voltage $V_{CAP}$ threshold comparisons is reset.

Next processing proceeds to step 96 where the respective values stored in the counters associated with the regulated voltage $V_{dd}$ threshold comparisons and the capacitor voltage $V_{CAP}$ (an unregulated voltage) threshold comparisons are compared as indicated against yet additional values. In step 96, the value of the counter with respect to (i.e., associated with or representing) the regulated voltage $V_{dd}$ is compared to a predetermined value PU_VALID. Such comparison is performed to determine whether the regulated voltage $V_{dd}$ (and, by association, the AC line voltage) are at a sufficient level to provide proper operational voltage to the electricity meter.

A similar comparison is made in step 96 of the value stored in the counter with respect to (i.e., associated with or representing) the voltage $V_{CAP}$ across storage capacitor 56 (FIG. 3) to the predetermined value PU_VALID. If both the value stored in the counter associated with the regulated voltage $V_{dd}$ threshold comparisons and the value stored in the counter associated with the capacitor (i.e., unregulated) voltage $V_{CAP}$ threshold comparisons are above the predetermined value PU_VALID, a positive result is indicated and processing proceeds to step 98 as shown, where the electricity meter enters a normal mode of operation. If, on the other hand, such comparison produces a negative result (because either one or both of the indicated comparisons prove negative), processing returns as indicated to steps 84 and 90, respectively, and loops through the other indicated steps until such time as a positive result is obtained at step 96 (i.e., a positive result for both comparisons). It should be borne in mind that, although a single value PU-VALID has been given for the two separate comparisons performed at representative step 96, different predetermined values may be ascribed to each of the two comparisons made in such step 96.

Referring finally to FIG. 5, the power failure detection process will be described. As illustrated in FIG. 5, the power failure detection process begins with the electricity meter operating in a normal mode, as indicated by step 98. Such step 98 of FIG. 5 is the same step 98, represented at the conclusion of the FIG. 4 operational sequence. In other words, the initial step of the power failure detection operations is equivalent (meter status wise) to the corresponding step shown as the final step in the power up operations depicted in FIG. 4.

From established normal mode 98, processing per exemplary FIG. 5 proceeds to step 100, where the regulated voltage $V_{dd}$ is compared to the first predetermined threshold value TH1. If such comparison determines that the regulated voltage $V_{dd}$ is less than such threshold value TH1, the value of the counter associated with the regulated voltage $V_{dd}$ threshold comparisons is increased at step 102. Otherwise, the value of the counter associated with the regulated voltage $V_{dd}$ threshold comparisons is reset at step 104, as indicated.

Following the evaluation of the regulated voltage $V_{dd}$, processing per exemplary FIG. 5 proceeds to step 106, where two separate evaluations are made. First, the value of the counter associated with the regulated voltage $V_{dd}$ threshold comparisons is examined to determine whether such is greater that a predetermined value PF_DETECTED. Secondly, the value associated with voltage $V_{CAP}$ across storage capacitor 56 (FIG. 3) threshold comparisons is examined to determine whether such is less that a third predetermined threshold value TH3. If either of these two comparisons is positive, a power fail condition is recognized to exist and processing proceeds to step 108, where an indication of such power failure is given. FIG. 5 shows such step 108 as an indication of "POWER FAILURE PROCEDURE," which means that power failure procedures in accordance with present subject matter are then to be undertaken. Such power failure indication from step 108 proceeds to step 80, as indicated, wherein a reset of the MCU is produced.

It should be noted at this point that two different predetermined threshold values TH2 and TH3 are represented as being provided and used at various points of operation as comparison values for the voltage $V_{CAP}$ across the storage capacitor 56 (FIG. 3). Such difference in threshold values may be intentionally chosen in accordance with present subject matter such that a hysteresis effect is produced to avoid unnecessary cycling of the electronic metrology package 20. It should also be noted that the MCU reset step 80 (FIG. 5) is the same starting point from which the power up process began (FIG. 4). So, operational process is back to where it began, wherefore, of course the next step, step 82 of the power up process, it is shown, involved MCU initialization.

Within the context of the present subject matter, such initialization (step 82) takes on special meaning in that, as it will be recalled, one of the ways the electronic metrology package enters the MCU reset step 82 is by repeated failure to successfully write collected dynamic data to one of the memory areas 100 or 102 (FIG. 2). Thus, during the MCU initialization step 82 (FIG. 4), it is important to select data from the most appropriate memory area 100 or 102 as that data which is used as the initialization dynamic data for the electronic metrology package 20. The choice of which memory block to use may depend on several factors, in accordance with present subject matter. A first factor is based on the validation of the CRC16 checksum bytes against the data stored in the memory. The block that is not chosen as the initial data reference will be chosen to be the block that is written to first, once dynamic data is determined by the electronic metrology package to be committed.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. An electricity meter for monitoring electrical parameters relating to power flow from a source to a load, comprising:
    a metrology portion comprising a dynamic data gathering portion, a power supply portion, and a controller portion, said controller portion being configured and operative for causing said electricity meter to variously operate in at least one of a power-up mode, a normal mode, and a power fail mode;
    a memory portion having a first memory area, a second memory area, and a third memory area, said first memory area and said second memory area being configured for storing dynamic data collected by said dynamic data gathering portion of said metrology portion, and said third memory area being configured for storing static data; and
    a power monitoring portion having an input configured for monitoring a source and having an output portion;
    wherein said controller portion of said metrology portion is configured and operative for causing said dynamic data gathering portion to collect dynamic data and to alternately store such collected dynamic data in said first memory area and said second memory area, and to control a power-up operation of said electricity meter during said power-up mode such that upon such power-up operation said controller portion sets initial operating parameters for said electricity meter based on static data stored in said third memory area and based on collected dynamic data stored in a predetermined one of said first memory area and said second memory area.

2. An electricity meter as in claim 1, wherein said controller portion of said metrology portion is configured and operative for causing said dynamic data gathering portion to collect individual data sets seriatim, write a first data set to said first memory area, write a second data set to said second memory area, and write subsequently collected individual data sets alternately to said first memory area and said second memory area.

3. An electricity meter, for monitoring electrical parameters relating to power flow from a source to a load, comprising:
    a metrology portion comprising a dynamic data gathering portion, a power supply portion, and a controller portion, said controller portion being configured and operative for causing said electricity meter to variously operate in at least one of a power-up mode, a normal mode, and a power fail mode;
    a memory portion having a first memory area, a second memory area, and a third memory area, said first memory area and said second memory area being configured for storing dynamic data collected by said dynamic data gathering portion of said metrology portion, and said third memory area being configured for storing static data; and
    a power monitoring portion having an input configured for monitoring a source and having an output portion;
    wherein said controller portion of said metrology portion is configured and operative for causing said dynamic data gathering portion to collect dynamic data and to alternately store such collected dynamic data in said first memory area and said second memory area, and to control a power-up operation of said electricity meter during said power-up mode such that upon such power-up operation said controller portion sets initial operating parameters for said electricity meter based on static data stored in said third memory area and based on collected dynamic data stored in a predetermined one of said first memory area and said second memory area;
    wherein said controller portion of said metrology portion is configured and operative for causing said dynamic data gathering portion to collect individual data sets seriatim, write a first data set to said first memory area, write a second data set to said second memory area, and write subsequently collected individual data sets alternately to said first memory area and said second memory area; and
    wherein said controller portion of said metrology portion is configured and operative for reading each data set immediately after writing said each data set, comparing such read data set with such written data set, and rewriting the data set if the comparison indicates that such read data set is not equal to such written data set.

4. An electricity meter as in claim 1, wherein said first memory area and said second memory area respectively correspond to separate address portions of a single memory device.

5. An electricity meter as in claim 4, wherein said single memory device is a non-volatile memory device.

6. An electricity meter as in claim 1, wherein said first memory area and said second memory area respectively are separate memory devices.

7. An electricity meter as in claim 6, wherein said separate memory devices respectively for said first memory area and said second memory area are respectively separate non-volatile memory devices.

8. A method for operation of a utility meter to improve memory integrity thereof for preservation of consumption data regardless of intermittent power outages, comprising the steps of:
   providing a first memory portion associated with a utility meter;
   providing a second memory portion associated with such utility meter;
   collecting consumption data in the form of individual data sets seriatim from a data source associated with such utility meter;
   writing to the first memory portion a first data set collected during the step of collecting;
   writing to the second memory portion a second data set collected during the step of collecting;
   writing subsequently collected individual data sets alternately to the first memory portion and the second memory portion;
   reading each data set immediately after each step of writing such data set;
   comparing each such read data set with such written data set;
   rewriting such data set if the step of comparing indicates that each such read data set is not equal to such written data set; and
   repeating the steps of comparing and rewriting a predetermined number of times.

9. A method as in claim 8, wherein the steps of providing comprise:
   providing a memory device;
   assigning a first portion of the memory device as the first memory portion; and
   assigning a second portion of the memory device as the second memory portion.

10. A method as in claim 8, wherein the steps of providing comprise:
    providing a first memory device as the first memory portion; and
    providing a second memory device as the second memory portion.

11. A method as in claim 8, wherein the step of providing comprises:
    providing a non-volatile memory device.

12. The method of claim 11, wherein:
    the step of providing a first memory device comprises providing a first non-volatile memory device as the first memory portion; and
    the step of providing a second memory device comprises providing a second non-volatile memory device as the second memory device.

13. A method as in claim 8, further comprising the steps of:
    providing the utility meter as an electricity meter associated with an AC mains and provided with a power supply portion having associated therewith a regulated voltage, and provided with a power monitoring portion having associated therewith an unregulated voltage;
    monitoring such regulated voltage and such unregulated voltage;
    establishing a power fail mode of operation for the electricity meter based on determinations that either of such voltages decrease below predetermined thresholds; and
    establishing a normal mode of operation for the electricity meter based no determinations that both of such voltages increase to at least respective predetermined minimum thresholds.

14. A method as in claim 13, further comprising the step of differentially
    establishing such thresholds so as to provide a hysteresis effect, with the electricity meter entering such power fail and normal respective modes of operation at different voltage levels, for decreased sensitivity to any transient ambient electrical noise or adverse AC mains conditions.

15. A method for operating an electricity meter for preservation of consumption data stored therein regardless of intermittent power outages, such electricity meter of the type having a dynamic data gathering portion, a power supply portion, a controller portion, a memory portion, and a power monitoring portion, said method comprising the steps of:
    a) storing meter initialization values in the memory portion;
    b) incrementing a first counter if the output from the power supply portion is greater than a first predetermined initialization value;
    c) resetting such first counter if the output from the power supply portion is not greater than such first predetermined initialization value;
    d) incrementing a second counter if the output from the power monitoring portion is greater than a second predetermined initialization value;
    e) resetting such second counter if the output from the power monitoring portion is not greater than such second predetermined initialization value;
    f) repeating steps b) through e) if the count stored in such first counter does not exceed a third predetermined initialization value and if the count stored in such second counter does not exceed a fourth predetermined initialization value; and
    g) causing the electricity meter to enter a normal operation mode.

16. A method for operating an electricity meter as in claim 15, further comprising the steps of:
    h) incrementing such first counter if the output from the power supply portion is less than such first predetermined initialization value;
    i) resetting such first counter if the output from the power supply portion is not less than such first predetermined initialization value;
    j) repeating steps h) through i) if either the count stored in such first counter is greater than a fifth predetermined initialization value or if the output from the power monitoring portion is less than a sixth predetermined initialization value; and
    k) causing the electricity meter to enter a power fail mode.

17. A method for operating an electricity meter as in claim 16, further comprising the steps of:

l) causing the dynamic data gathering portion to collect data sets seriatim;

m) writing a first collected data set to a first memory area of the memory portion;

n) writing a second collected data set to a second memory area of the memory portion;

o) writing subsequently collected data sets alternately to such first memory area of the memory portion and such second memory area of the memory portion; and p) performing step a) based on data stored in one of such first memory area and said second memory area of the memory portion.

18. A method for operating an electricity meter as in claim 17, further comprising the steps of:

q) reading each data set immediately after each step of writing each such data set;

r) comparing such read data set with such written data set;

s) rewriting such data set if the step r) of comparing indicates that such read data set is not equal to such written data set;

t) repeating steps r) and s) a predetermined number of times; and u) indicating a failure if step r) does not indicate that such read data set is equal to such written data set.

19. A utility meter with improved memory integrity for preservation of consumption data regardless of intermittent power outages, comprising:

electronic metrology means for monitoring and sensing consumption of a utility commodity and for generating corresponding consumption data relative thereto in predetermined seriatim data sets;

a pair of non-volatile memory storage devices operative in tandem as double buffered storage elements; and read/write logic for operating said memory storage devices in relation to said predetermined seriatim data sets such that valid consumption data is maintained if operatively possible in at least one of said non-volatile memory storage devices, such read/write logic operating so as to:

write to a first memory portion of said pair of non-volatile memory storage devices a first data set collected during the step of collecting;

write to a second memory portion of said pair of non-volatile memory storage devices a second data set collected during the step of collecting;

write subsequently collected individual data sets alternately to the first memory portion and the second memory portion;

read each data set immediately after each step of writing such data set;

compare each such read data set with such written data set;

rewrite such data set if the step of comparing indicates that each such read data set is not equal to such written data set; and repeat the steps of comparing and rewriting a predetermined number of times.

20. A utility meter as in claim 19, wherein said read/write logic comprises a hardwired device operatively associated with said memory storage devices.

21. A utility meter as in claim 19, wherein said read/write logic comprises a programmable device and implementing associated software, collectively operatively associated with said memory storage devices.

22. A utility meter as in claim 19, wherein said utility commodity is electricity.

23. A utility meter as in claim 19, wherein said memory storage devices each comprise one of an EEPROM, a FLASH memory device, a magnetic medium, and a battery backed RAM.

24. An electricity meter as in claim 3, wherein said first memory area and said second memory area respectively correspond to separate address portions of a single memory device.

25. An electricity meter as in claim 24, wherein said single memory device is a non-volatile memory device.

26. An electricity meter as in claim 3, wherein said first memory area and said second memory area respectively are separate memory devices.

27. An electricity meter as in claim 26, wherein said separate memory devices respectively for said first memory area and said second memory area are respectively separate non-volatile memory devices.

* * * * *

UNITED STATES PATENT AND TRADEMARK OFFICE
CERTIFICATE OF CORRECTION

| | | |
|---|---|---|
| PATENT NO. | : 7,269,522 B2 | Page 1 of 1 |
| APPLICATION NO. | : 11/211138 | |
| DATED | : September 11, 2007 | |
| INVENTOR(S) | : Mike Peters et al. | |

It is certified that error appears in the above-identified patent and that said Letters Patent is hereby corrected as shown below:

In Column 14, line 65, please replace "is configured" with --is further configured--.

Signed and Sealed this

Eleventh Day of December, 2007

JON W. DUDAS
*Director of the United States Patent and Trademark Office*